(12) United States Patent
Takase

(10) Patent No.: US 6,449,297 B1
(45) Date of Patent: Sep. 10, 2002

(54) POWER SUPPLY UNIT FOR SOLID-STATE LASER, SOLID STATE LASER, AND LASER BEAM GENERATOR

(75) Inventor: Tomohiro Takase, Sagamihara (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/694,351

(22) Filed: Oct. 24, 2000

(30) Foreign Application Priority Data

Oct. 25, 1999 (JP) .......................................... 11-302127

(51) Int. Cl.[7] .................................................. H01S 3/00
(52) U.S. Cl. .................................. 372/38.04; 372/38.07
(58) Field of Search .............................. 372/38.04, 38.07

(56) References Cited

U.S. PATENT DOCUMENTS 5,883,546 A 3/1999 Kaminishi et al.

FOREIGN PATENT DOCUMENTS

| | | |
|---|---|---|
| DE | 42 10 022 A1 | 3/1992 |
| DE | 195 15 963 A1 | 5/1995 |
| EP | 0 385 470 A2 | 3/1990 |
| EP | 0 687 046 A2 | 6/1995 |
| EP | 0 803 947 A2 | 4/1997 |
| EP | 0 939 469 A2 | 1/1999 |
| JP | 4-42979 | 2/1992 |
| JP | 8-317655 | 11/1996 |

*Primary Examiner*—Leon Scott, Jr.
(74) *Attorney, Agent, or Firm*—Oblon, Spivak, McClelland, Maier & Neustadt, P.C.

(57) ABSTRACT

A solid-state laser comprises an excitation light source having a semiconductor laser array, a plurality of chopper circuits arranged between a direct-current power supply and an output terminal of the semiconductor laser array and connected in parallel with each other, for applying resultant power of the chopper circuits to the semiconductor laser array, a current controller for controlling the plurality of chopper circuits to modulate the resultant power at time resolution ranging from 1 $\mu$s to 100 $\mu$s, a solid-laser medium excited by a laser beam emitted from the semiconductor laser array, and a pair of mirrors for resonating a laser beam generated by exciting the solid-state medium.

15 Claims, 4 Drawing Sheets

POWER SUPPLY UNIT FOR SOLID-STATE LASER, SOLID STATE LASER, AND LASER BEAM GENERATOR

CROSS-REFERENCE TO RELATED APPLICATIONS

This application is based upon and claims the benefit of priority from the prior Japanese Patent Application No. 11-302127, filed Oct. 25, 1999, the entire contents of which are incorporated herein by reference.

BACKGROUND OF THE INVENTION

The present invention relates to an output control technique of controlling a laser pulse of a solid-state laser, which is excited by a semiconductor laser array, in time-function waveform.

Recently, the number of cases where a very thin material is processed using a solid-state laser (e.g., welding of an aluminum plate having a thickness of 0.1 mm or less and deposition of plastic components) has been increased as electronic components are miniaturized. Therefore, as shown in FIG. 5A, the pulse width ranges from 100 $\mu$s to 500 $\mu$s, and the pulse waveform of the solid-state laser has to be controlled by setting the current of one pulse as a function of time.

As a method of controlling the pulse output from a solid-state laser in arbitrary waveform, it can be thought to optically form a pulse through a Q-switching operation or under the control of a power supply.

In the Q-switching operation, a pulse is formed optically by the operation of a high-speed shutter set in an optical resonator. In other words, when the high-speed shutter is opened, a laser oscillator consumes energy accumulated in an excitation medium and starts to oscillate. The laser oscillator stops oscillating when it completely consumes the energy. The time period during which the laser oscillator oscillates corresponds to the pulse width. Usually, the pulse width is of the order of nanoseconds and the pulse is in a single-peak shape. Since the Q-switching operation is a self-excited oscillation, it is difficult to control one pulse in arbitrary form.

In the self-excited oscillation, a very-high-density inverted population is achieved if a loss of the optical resonator is increased to prevent the laser oscillator from oscillating while the laser oscillator is pumping laser materials and, if the loss is suddenly decreased to obtain a large Q value which is advantageous for oscillation, the accumulated energy is released explosively in several nanoseconds to several tens of nanoseconds. The Q-switching operation is performed based on the above principle. It is therefore difficult to control one pulse of a laser beam in arbitrary form at time resolution of 10 $\mu$s to 500 $\mu$s.

According to the power supply control, a pulse is excited by controlling electric energy applied to a flash lamp serving as an excitation source. Since, in this case, the power supply control is electric control, the pulse width and pulse shape can be controlled relatively easily if the pulse width is larger than a certain value. For example, Jpn. Pat. Appln. KOKAI Publication No. 4-42979 discloses a technique of controlling heat input to a process point by controlling one pulse in arbitrary waveform when the pulse width ranges from 1 ms to 20 ms.

Since, however, the start-up responsivity of the flash lamp falls within a range of 100 $\mu$s to 500 $\mu$s, it is extremely difficult to control one pulse in arbitrary form when the pulse width ranges from 10 $\mu$s to 500 $\mu$s.

FIGS. 5A to 5C are graphs of pulse waveforms controlled by the excitation of a flash lamp. FIG. 5A shows a preset waveform in which the pulse width is set to five steps which differ from each other by 20 $\mu$s within 100 $\mu$s. FIG. 5B shows a current waveform. However, it does not correspond to the preset waveform at all when the pulse width is 100 $\mu$s but simply exhibits a single curve. FIG. 5C shows a laser waveform. Like the current waveform, the laser waveform does not correspond to the preset waveform at all when the pulse width is 100 $\mu$s. There is no correlation between the laser waveform and the preset waveform when the pulse width is 100 $\mu$s. The laser waveform also simply exhibits a single curve.

In other words, the flash lamp excitation requires response time of at least 100 $\mu$s, so that the current and laser waveforms cannot follow the preset waveform varying 20 $\mu$s by 20 $\mu$s and greatly differ in shape from the preset waveform.

As the rising characteristics of pulses of the flash lamp, the flash lamp is large in individual difference and easy to vary with time. For example, when a sharp peak is set at the beginning of a pulse waveform which corresponds to the pulse width of 100 $\mu$s, the peak is always susceptible to individual differences of the flash lamp and variations with time thereof, which greatly influences a process using the flash lamp.

Because of the above-described characteristics of the flash lamp, it is very difficult to control one pulse in time-function waveform when the pulse width is 500 $\mu$s or less.

BRIEF SUMMARY OF THE INVENTION

The object of the present invention is to achieve a high-precision laser process by controlling one pulse in time-function waveform even when the pulse width is 500 $\mu$s or less.

According to the present invention, there is provided a power supply unit for a solid-state laser using a semiconductor laser array as an excitation light source, comprising a plurality of chopper circuits arranged between a direct-current power supply and an output terminal of the semiconductor laser array and connected in parallel with each other, for applying resultant power of the chopper circuits to the semiconductor laser array, and a current controller for controlling the plurality of chopper circuits to modulate the resultant power at time resolution ranging from 1 $\mu$s to 100 $\mu$s.

The present invention allows one pulse to be modulated and controlled in time-function waveform at time resolution ranging from 1 $\mu$s to 100 $\mu$s even when the pulse width is 500 $\mu$s or less, with the result that a high-precision laser process can be executed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
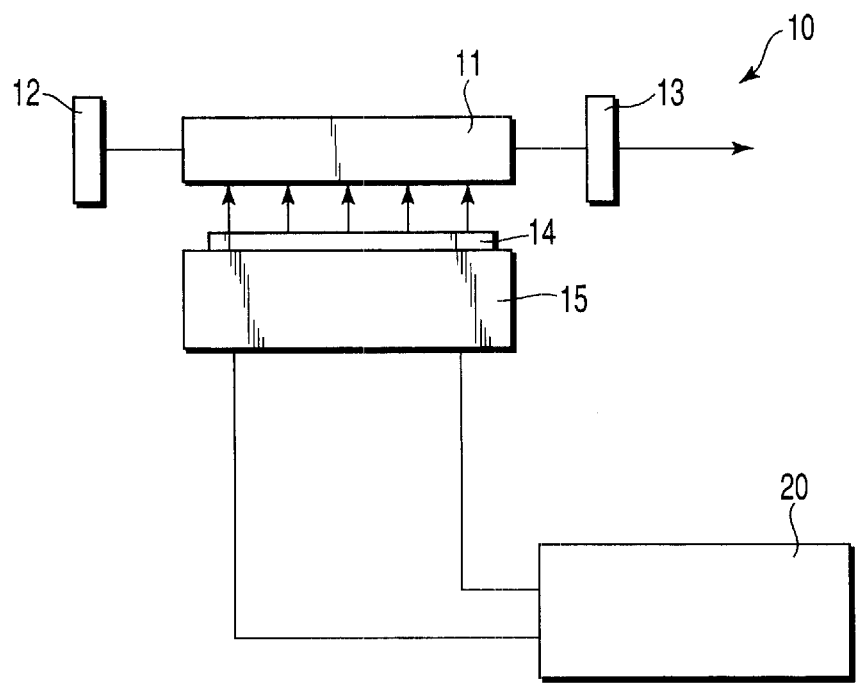
FIG. 1A is a schematic diagram showing the structure of a solid-state laser according to an embodiment of the present invention.
Figure 1B:
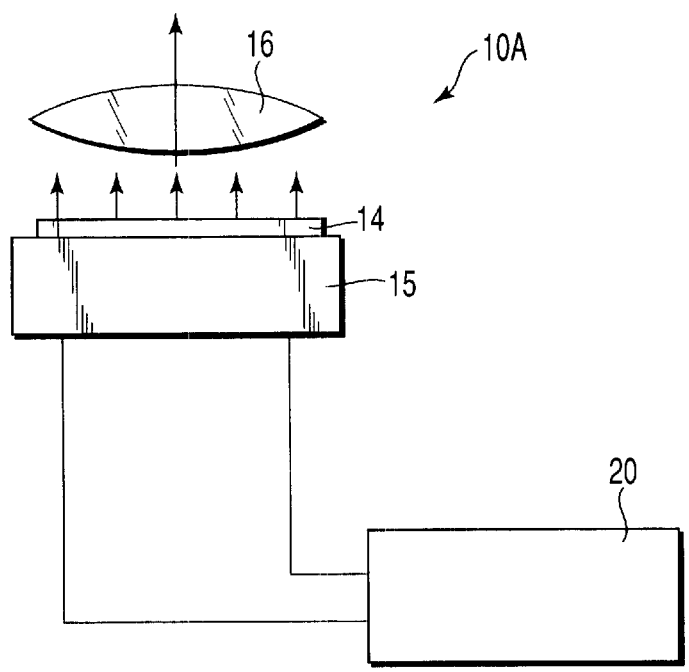
FIG. 1B is a schematic diagram showing the structure of a laser-beam generator according to the embodiment of the present invention.

FIG. 1A is a schematic diagram showing the structure of a solid-state laser 10 according to an embodiment of the present invention, and FIG. 1B is a schematic diagram showing the structure of a laser-beam generator 10A according to the embodiment of the present invention.

The solid-state laser 10 includes a laser medium 11 using a YAG rod as a solid-state medium and a reflector 12 and an output mirror 13 arranged at both ends of the laser medium 11 along an optical axis thereof to constitute an optical resonator. The laser 10 also includes a semiconductor laser array 14 for excitation and a heat sink 15 for cooling. The semiconductor laser array 14 is arranged in parallel with the optical axis of the laser medium 11 and integrally with the heat sink 15 as one component. The output of the semiconductor laser array 14 is controlled by a power supply 20 having a waveform control function using a dither circuit as is disclosed in, for example, Jpn. Pat. Appln. KOKAI Publication No. 8-317655.

The laser-beam generator 10A converges laser beams, which are emitted from the semiconductor laser array 14, on a lens 16. The converged laser beam is output from the lens 16.

Figure 2:
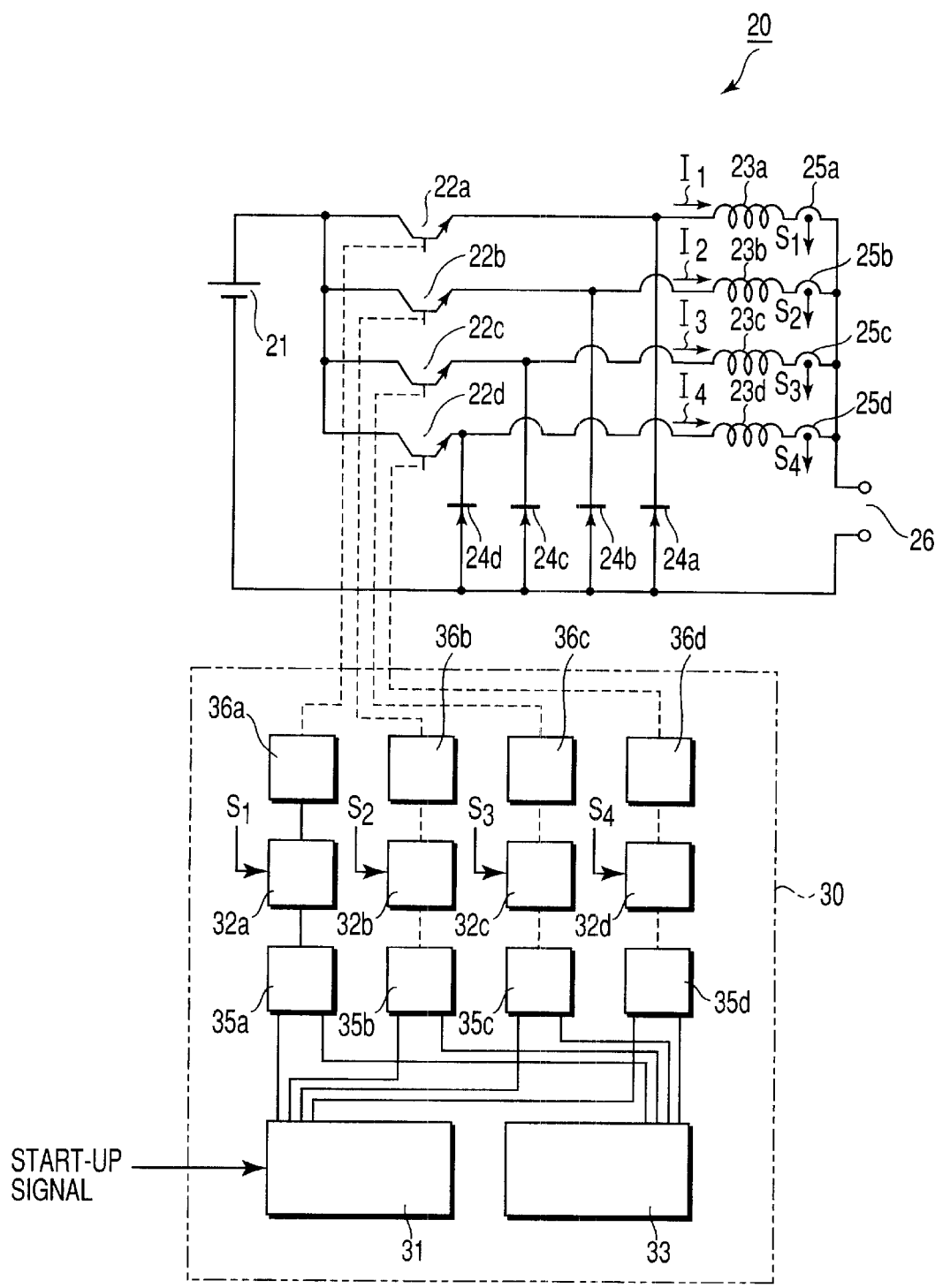
FIG. 2 is a circuit diagram of a power supply having a waveform control function which is incorporated into the solid-state laser.

The power supply 20 is so constituted as shown in the circuit diagram of FIG. 2. In FIG. 2, reference numeral 21 denotes a DC power supply, 22a to 22d indicate switching elements (IGBT) for current control, 23a to 23d show reactors for smoothing a DC current, 24a to 24d are diodes, 25a to 25d represent current monitors, 26 indicates an output terminal, and 30 shows a control circuit. The switching elements 22a to 22d, reactors 23a to 23d, and diodes 24a to 24d constitute four chopper circuits of a current control type which are connected to each other.

The control circuit 30 includes a current reference signal generator 31, an oscillator circuit 33, dither circuits 35a to 35d (which will be described later) connected to the oscillation circuit 33, comparators 32a to 32d connected to the current reference signal generator 31 through the dither circuits 35a to 35d, and driver circuits 36a to 36d connected to the comparators 32a to 32d.

Figure 3A:
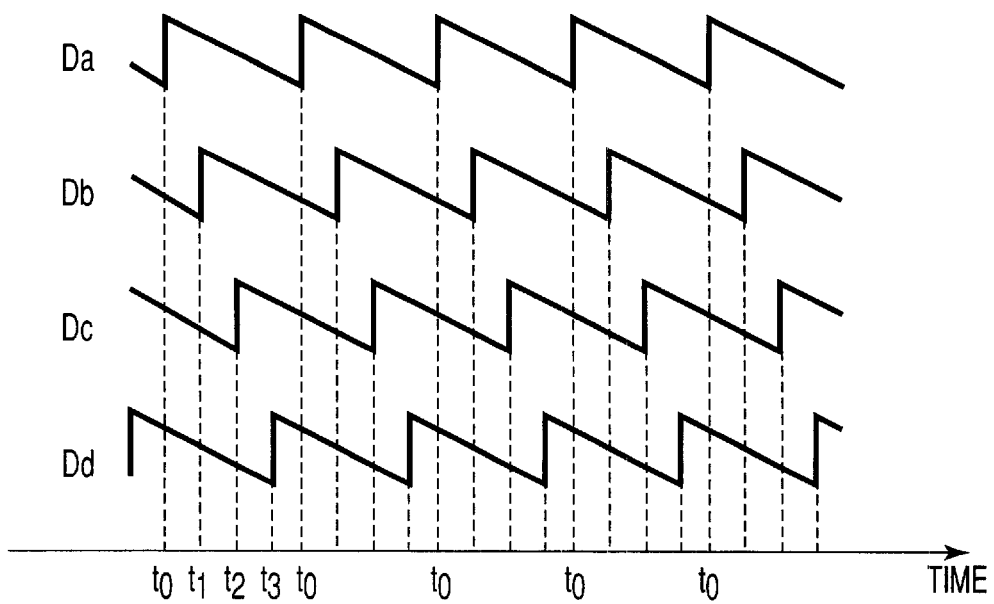
FIG. 3A is a graph explaining waveforms of dither signals.

Upon receiving a start-up signal, the current reference signal generator 31 outputs a current reference signal SO having a preset voltage pattern (time-function waveform). The comparators 32a to 32d compare dither superimposition signals Sa to Sd (which will be described later) and output signals S1 to S4 corresponding to output currents I1 to I4 of the chopper circuits detected by the current monitors 25a to 25d, and output on/off signals. The oscillator circuit 33 generates clock pulses Ra to Rd whose phases differ from each other by 900° at a fixed frequency. The dither circuits 35a to 35d generate saw-tooth dither signals Da to Dd which are synchronized with the clock pulses Ra to Rd and gradually decrease as shown in FIG. 3A, and superimpose the dither signals on the input current reference signal SO, thereby outputting dither superimposed signals Sa to Sd. The driver circuits 36a to 36d turn on/off the switching elements 22a to 22d in response to the signals from the comparators 32a to 32d.

Paying attention to one chopper circuit, the control of switching elements will now be described. Upon receiving a start-up signal, the current reference signal generator 31 outputs a current reference signal SO having a time-function waveform. The oscillator circuit 33 outputs a clock pulse Ra from which a dither signal Da is generated. The dither signal Da is superimposed on the current reference signal SO and the dither superimposition signal Sa is input to the comparator 32a.

When the level of an output signal S1 of the current monitor 25a is lower than that of the dither superimposition signal Sa, the comparator 32a outputs an on-signal to turn on the switching element 22a through the driver circuit 36a. If the switching element 22a turns on, the DC power supply 21 supplies power and the current I1 gradually increases through the reactor 23a.

When the increase of current I1 makes the level of the output signal S1 of the current monitor 25a higher than that of the dither superimposition signal Sa, the comparator 32a outputs an off-signal to turn off the switching element 22a through the driver circuit 36a. If the switching element 22a turns off, the power accumulated in the reactor 23a returns through the output terminal 26 and the diodes 24a to 24d and attenuates gradually.

The above operation is performed at high speed for each period of clock pulse Ra, and the output terminal 26 is supplied with a direct current I1 having almost the same waveform as that of the dither superimposition signal Sa.

Figure 3B:
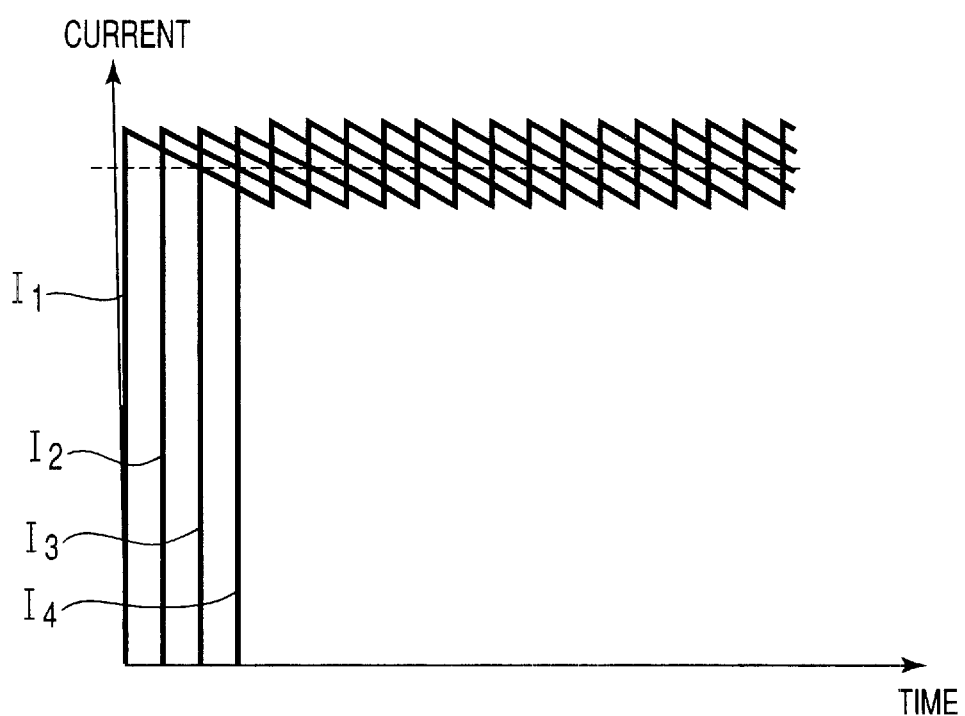
FIG. 3B is a graph explaining waveforms of output currents.

Similarly, the output terminal 26 is supplied with direct currents I1 to I4. Since the periods of clock pulses output from the oscillator circuit 33 are shifted from each other by 90°, the direct currents have waveforms as shown in FIG. 3B. The output terminal 26 is supplied with a combined current of I1 to I4 and finally supplied with a smooth direct current with few ripples.

The dither circuits 35a to 35d are provided for the following reason. The comparators 32a to 32d compare the output signals of the current monitors 25a to 25d with reference to a fixed voltage. The switching elements 22a to 22d turn on when the output signals are lower than the reference voltage, and they turn on when the output signals are higher than the reference voltage. In other words, the switching elements 22a to 22d turn on/off in accordance with a slight variation in voltage. It is thus likely that the switching elements will be operated frequently and destroyed accordingly.

Even though the dither signals turn off the switching elements 22a to 22d and lower the voltage from the current monitors, the reference voltage is also lowered by the dither signal and thus the voltage does not lower than the reference voltage. Consequently, an interval between the turn-on and turn-off of the switching elements 22a to 22d can be set to more than a fixed one by the dither signals.

As described above, the output terminal 26 supplies the semiconductor laser array 14 with power having the same time-function waveform as that of the current reference signal SO.

It is therefore the feature of the present invention that one pulse output from a solid-state laser excited by a semiconductor laser array of QCW (quasi-CW) specifications can be controlled in time-function waveform using a dither circuit.

In a conventional solid-state laser excited by a semiconductor laser array of QCW specifications, a rectangular-wave operation was recommended and thus the power supply to the semiconductor laser array was limited to a rectangular-wave operation to be performed using a stabilized power supply. As compared with the conventional solid-state laser which outputs a rectangular-wave pulse or outputs a single-peak pulse using a Q switch, the control of the present invention is improved in precision more greatly and one pulse can be controlled in time-function waveform more exactly.

In the foregoing embodiment, four circuits are arranged in parallel according to the dither control method in which the dither circuits are used for the power supply of the semiconductor laser array; consequently, response time of 10 $\mu$s can be achieved at 100 A at a switching frequency of 75 kHz×4 (circuits).

Figure 4A:
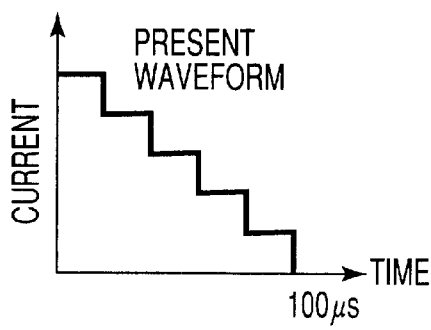
FIGS. 4A to 4C are graphs showing waveform control of the present invention by excitation of an LD.
Figure 4B:
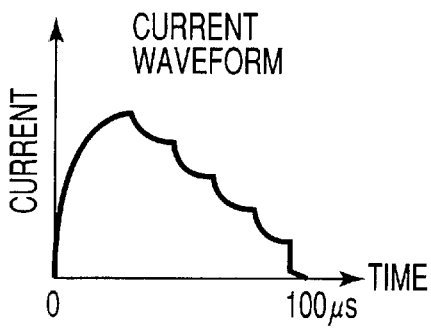
Figure 4C:
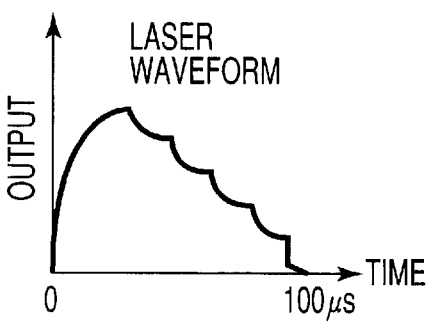

FIGS. 4A to 4C are diagrams explaining the waveform control of the solid-state laser 10 excited by the semiconductor laser array. FIG. 4A shows a preset waveform in which the pulse width is set to five steps differing from each other by 20 $\mu$s within 100 $\mu$s.

FIG. 4B shows a current waveform in which the pulse width is set to deformed five steps corresponding to those of the preset waveform shown in FIG. 4A. Similarly, FIG. 4C shows a laser waveform in which the pulse width is set to deformed five steps corresponding to those of the preset waveform shown in FIG. 4A.

Figure 5A:
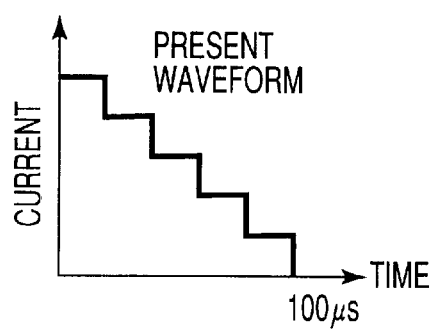
FIGS. 5A to 5C are graphs showing prior art waveform control by excitation of a lamp.
Figure 5B:
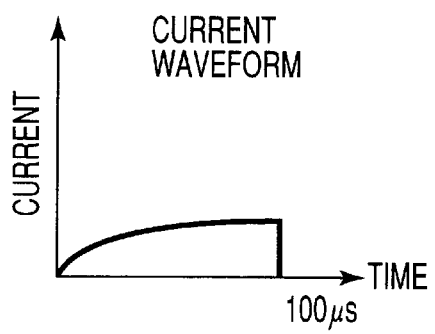
Figure 5C:
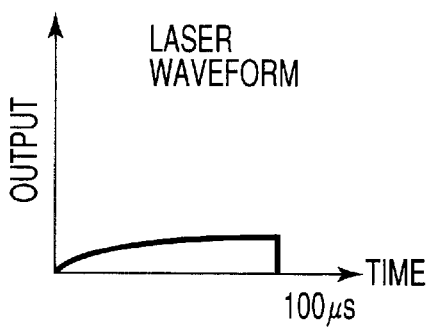

Unlike the prior art flash lamp excitation shown in FIGS. 5A to 5C, the laser array excitation allows a shape closely analogous to a preset time-function waveform to be obtained since the response time is 10 $\mu$s which is shorter than 20 $\mu$s. According to the present invention, one pulse can be controlled in time-function waveform even when the pulse width is 500 $\mu$s or smaller.

The present invention is not limited to the above-described embodiment. In the embodiment, the voltage applied to the semiconductor laser array is controlled. However, the current supplied to the semiconductor laser array or the power applied thereto can be controlled. The number of chopper circuits is not limited to four. In the embodiment, a power supply circuit of a switching system using a dither circuit is employed; however, it can be replaced with a dropper system. Needless to say, various changes and modifications can be made without departing from the scope of the subject matter of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power supply unit for a solid-state laser using a semiconductor laser array as an excitation light source, comprising:

a plurality of chopper circuits arranged between a direct-current power supply and a terminal of the semiconductor laser array and connected in parallel with each other, for applying resultant power of the chopper circuits to the semiconductor laser array; and a current controller for controlling the plurality of chopper circuits to modulate the resultant power at time resolution ranging from 1 $\mu$s to 100 $\mu$s.

2. The power supply unit according to claim 1, wherein the current controller includes:

time-function waveform signal generating means for generating a preset time-function waveform signal;

reference signal generating means for generating a reference signal having time resolution ranging from 1 $\mu$s to 100 $\mu$s for each of the chopper circuits in response to the time-function waveform signal; and comparing means for comparing the reference signal and an output signal of each of the chopper circuits corresponding to the reference signal to output a switching signal of each of the chopper circuits.

3. The power supply unit according to claim 1, wherein the current controller includes:

time-function waveform signal generating means for generating a preset time-function waveform signal;

reference signal generating means for generating a reference signal having time resolution ranging from 1 $\mu$s to 100 $\mu$s for each of the chopper circuits in response to the time-function waveform signal; and comparing means for comparing the reference signal and an output signal of each of the chopper circuits corresponding to the reference signal to output a switching signal of each of the chopper circuits, and the reference signal is periodic and has a phase difference corresponding to each of the chopper circuits such that a sum of outputs of the chopper circuits is smoothed.

4. The power supply unit according to claim 1, wherein the plurality of chopper circuits include four chopper circuits, and the current controller includes:

time-function waveform signal generating means for generating a preset time-function waveform signal;

reference signal generating means for generating a reference signal having time resolution ranging from 1 $\mu$s to 100 $\mu$s for each of the chopper circuits in response to the time-function waveform signal; and comparing means for comparing the reference signal and an output signal of each of the chopper circuits corresponding to the reference signal to output a switching signal of each of the chopper circuits, and the reference signal is periodic and has a phase difference of 90 degrees corresponding to each of the chopper circuits such that a sum of outputs of the chopper circuits is smoothed.

5. A solid-state laser comprising:

an excitation light source having a semiconductor laser array;

a plurality of chopper circuits arranged between a direct-current power supply and a terminal of the semiconductor laser array and connected in parallel with each other, for applying resultant power of the chopper circuits to the semiconductor laser array;

a current controller for controlling the plurality of chopper circuits to modulate the resultant power at time resolution ranging from 1 $\mu$s to 100 $\mu$s;

a solid-state laser medium excited by a laser beam emitted from the semiconductor laser array; and a pair of mirrors for resonating a laser beam generated by exciting the solid-state medium.

6. The solid-state laser according to claim 5, wherein the current controller includes:

time-function waveform signal generating means for generating a preset time-function waveform signal;

reference signal generating means for generating a reference signal having time resolution ranging from 1 μs to 100 μs for each of the chopper circuits in response to the time-function waveform signal; and comparing means for comparing the reference signal and an output signal of each of the chopper circuits corresponding to the reference signal to output a switching signal of each of the chopper circuits.

7. The solid-state laser according to claim 5, wherein the current controller includes:

time-function waveform signal generating means for generating a preset time-function waveform signal;

reference signal generating means for generating a reference signal having time resolution ranging from 1 μs to 100 μs for each of the chopper circuits in response to the time-function waveform signal; and comparing means for comparing the reference signal and an output signal of each of the chopper circuits corresponding to the reference signal to output a switching signal of each of the chopper circuits, and the reference signal is periodic and has a phase difference corresponding to each of the chopper circuits such that a sum of outputs of the chopper circuits is smoothed.

8. The solid-state laser according to claim 5, wherein the plurality of chopper circuits include four chopper circuits, and the current controller includes:

time-function waveform signal generating means for generating a preset time-function waveform signal;

reference signal generating means for generating a reference signal having time resolution ranging from 1 μs to 100 μs for each of the chopper circuits in response to the time-function waveform signal; and comparing means for comparing the reference signal and an output signal of each of the chopper circuits corresponding to the reference signal to output a switching signal of each of the chopper circuits, and the reference signal is periodic and has a phase difference of 90 degrees corresponding to each of the chopper circuits such that a sum of outputs of the chopper circuits is smoothed.

9. A laser beam generator comprising:

a semiconductor laser array; and a power supply circuit for controlling at least one of power, voltage and current supplied to the semiconductor laser array at time resolution ranging from 1 μs to 100 μs.

10. The laser beam generator according to claim 9, wherein the power supply circuit includes:

a chopper circuit for connecting the semiconductor laser array to a direct-current power supply; and a controller for controlling the chopper circuit at the time resolution ranging from 1 μs to 100 μs.

11. The laser beam generator according to claim 9, wherein the power supply circuit includes:

a plurality of chopper circuits connected in parallel between a direct-current power supply and the semiconductor laser array; and a control circuit for controlling the plurality of chopper circuits at the time resolution ranging from 1 μs to 100 μs.

12. The laser beam generator according to claim 9, wherein the power supply circuit includes:

a plurality of chopper circuits connected in parallel between a direct-current power supply and the semiconductor laser array;

time-function waveform signal generating means for generating a preset time-function waveform signal;

reference signal generating means for generating a reference signal having time resolution ranging from 1 μs to 100 μs for each of the chopper circuits in response to the time-function waveform signal; and comparing means for comparing the reference signal and an output signal of each of the chopper circuits corresponding to the reference signal to output a switching signal of each of the chopper circuits.

13. The laser beam generator according to claim 9, wherein the power supply circuit includes:

a plurality of chopper circuits connected in parallel between a direct-current power supply and the semiconductor laser array;

time-function waveform signal generating means for generating a preset time-function waveform signal;

reference signal generating means for generating a reference signal having time resolution ranging from 1 μs to 100 μs for each of the chopper circuits in response to the time-function waveform signal; and comparing means for comparing the reference signal and an output signal of each of the chopper circuits corresponding to the reference signal to output a switching signal of each of the chopper circuits, and the reference signal is periodic and has a phase difference corresponding to each of the chopper circuits such that a sum of outputs of the chopper circuits is smoothed.

14. The laser beam generator according to claim 9, wherein the power supply circuit includes:

four chopper circuits connected in parallel between a direct-current power supply and the semiconductor laser array;

time-function waveform signal generating means for generating a preset time-function waveform signal;

reference signal generating means for generating a reference signal having time resolution ranging from 1 μs to 100 μs for each of the chopper circuits in response to the time-function waveform signal; and comparing means for comparing the reference signal and an output signal of each of the chopper circuits corresponding to the reference signal to output a switching signal of each of the chopper circuits, and the reference signal is periodic and has a phase difference of 90 degrees corresponding to each of the chopper circuits such that a sum of outputs of the chopper circuits is smoothed.

15. The laser beam generator according to claim 9, wherein the power supply circuit includes:

four chopper circuits connected in parallel between a direct-current power supply and the semiconductor laser array;

time-function waveform signal generating means for generating a preset time-function waveform signal;

a dither circuit for generating a reference signal having time resolution ranging from 1 μs to 100 μs for each of the chopper circuits in response to the time-function waveform signal; and comparing means for comparing the reference signal and an output signal of each of the chopper circuits corresponding to the reference signal to output a switching signal of each of the chopper circuits, and the reference signal is periodic and has a phase difference of 90 degrees corresponding to each of the chopper circuits such that a sum of outputs of the chopper circuits is smoothed.

* * * * *